(12) United States Patent
Sawada et al.

(10) Patent No.: US 8,191,758 B2
(45) Date of Patent: Jun. 5, 2012

(54) METHOD FOR MANUFACTURING SEMICONDUCTOR DEVICE

(75) Inventors: Kanako Sawada, Yokohama (JP); Hideo Aoki, Yokohama (JP); Naoyuki Komuta, Kawasaki (JP); Koji Ogiso, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/815,693

(22) Filed: Jun. 15, 2010

(65) Prior Publication Data

US 2010/0320258 A1  Dec. 23, 2010

(30) Foreign Application Priority Data

Jun. 19, 2009 (JP) .................. 2009-146153

(51) Int. Cl.
*B23K 31/02* (2006.01)
*H01L 21/44* (2006.01)
*H05K 3/00* (2006.01)

(52) U.S. Cl. .............. 228/180.22; 228/180.21; 438/612; 438/613; 29/840; 29/843

(58) Field of Classification Search ............. 228/180.22, 228/180.21; 438/612, 613; 29/840, 843
See application file for complete search history.

(56) References Cited

U.S. PATENT DOCUMENTS 5,992,729 A * 11/1999 Koopman et al. ............. 228/175
6,344,407 B1 * 2/2002 Matsuki et al. ............... 438/613
6,666,369 B2    12/2003 Matsuki et al.
2004/0108364 A1 * 6/2004 Ference et al. ........... 228/180.22

FOREIGN PATENT DOCUMENTS

| JP | 2001244283 | 9/2001 |
| JP | 2001244618 | 9/2001 |

OTHER PUBLICATIONS

Lin et al.; Study of Fluxless Soldering Using Formic Acid Vapor, IEEE Transactions on Advanced Packaging, vol. 22, No. 4, Nov. 1999, pp. 592-601.

* cited by examiner

*Primary Examiner* — Jessica L Ward
*Assistant Examiner* — Devang R Patel
(74) *Attorney, Agent, or Firm* — Turocy & Watson, LLP

(57) ABSTRACT

In one embodiment, a first substrate having first solder bumps and a second substrate having second solder bumps are stacked while temporarily tacking the solder bumps to each other, and then a stack is disposed inside a furnace. The gas in the furnace is exhausted to be in a reduced pressure atmosphere, and then a carboxylic acid gas is introduced into the furnace. While increasing a temperature inside the furnace where the carboxylic acid gas is introduced, the gas in the furnace is exhausted to be in a reduced pressure atmosphere at a temperature in a range from a reduction temperature of oxide films by the carboxylic acid gas to lower than a melting temperature of the solder bumps. By increasing the temperature inside the furnace up to a temperature in a range of the melting temperature of the solder bumps and higher, the first solder bumps and the second solder bumps are melted and joined.

14 Claims, 5 Drawing Sheets

METHOD FOR MANUFACTURING SEMICONDUCTOR DEVICE

CROSS REFERENCE TO RELATED APPLICATIONS

This application is based upon and claims the benefit of priority from Japanese Patent Application No. 2009-146153, filed on Jun. 19, 2009; the entire contents of which are incorporated herein by reference.

FIELD

Embodiments described herein relate generally to a method for manufacturing a semiconductor device.

BACKGROUND

In recent years, in order to deal with higher pin counts, fine pitches, and increase in signal speed of semiconductor chips, there are used semiconductor devices employing flip-chip connection as a mounting method having short wiring and connection lengths. When the flip-chip connection is applied to connection between semiconductor chips and connection between a semiconductor chip and a silicon interposer, solder bumps are formed on electrode pads of upper and lower chips (semiconductor chips or silicon interposers) respectively, the chips are aligned to face these solder bumps and stacked, and then the solder bumps are heated and melted to be connected.

In order to remove oxide films on the solder bumps, normally, fluxing agent is coated on the surfaces of the solder bumps, and then the upper and lower chips are aligned and stacked. Next, in a reflow chamber, the solder bumps are heated and melted to be connected, and then the fluxing agent is cleaned. However, in accordance with decreasing size and formation pitch of the solder bumps, it becomes difficult to clean the fluxing agent completely. A residue of the fluxing agent results in a problem.

Thus, it has been considered that the solder bumps are heated and melted to be connected while removing the oxide films on the surfaces of the solder bumps by a carboxylic acid such as a formic acid. In JP-A 2001-244618 (KOKAI) and JP-A 2001-244283 (KOKAI), it has been disclosed that in a state where a semiconductor chip having solder bumps is mounted on a wiring substrate, the semiconductor chip is disposed in a reduced pressure atmosphere containing a carboxylic acid gas, and the solder bumps are heated and melted in such an atmosphere. By heating the solder bumps in the reduced pressure atmosphere containing the carboxylic acid gas, the oxide films on the surfaces of the solder bumps are removed, and voids inside the solder bumps (solder layers) ascribable to gas to occur at the time of heating the solder are removed.

When solder bumps provided on upper and lower chips are connected each other, the solder bumps are temporarily tacked, and then the chips having the temporarily tacked solder bumps are disposed inside a reflow chamber. In this case, the oxide films are caught in interfaces between the temporarily tacked solder bumps, and it is difficult to achieve both improvement in connectivity between the solder bumps and suppression of voids to occur inside the solder bumps after being melted.

DETAILED DESCRIPTION

In one embodiment, a method of manufacturing a semiconductor device includes stacking a second substrate having second solder bumps on a first substrate having first solder bumps while temporarily tacking the first solder bumps and the second solder bumps, disposing a stack of the first substrate and the second substrate, in which the first solder bumps and the second solder bumps are temporarily tacked, inside a furnace, exhausting gas in the furnace where the stack is disposed to be in a reduced pressure atmosphere, introducing a carboxylic acid gas into the furnace in the reduced pressure atmosphere, exhausting gas in the furnace to be in a reduced pressure atmosphere at a temperature in a range from a reduction temperature of oxide films on the first and second solder bumps by the carboxylic acid gas to lower than a melting temperature of the first and second solder bumps while increasing a temperature inside the furnace where the carboxylic acid gas is introduced, and joining the first solder bumps and the second solder bumps by increasing a temperature inside the furnace in the reduced pressure atmosphere up to a temperature in a range of the melting temperature of the first and second solder bumps and higher, and melting the first solder bumps and the second solder bumps.

In another embodiment, a method of manufacturing a semiconductor device includes stacking a second substrate having second solder bumps on a first substrate having first solder bumps while temporarily tacking the first solder bumps and the second solder bumps, disposing a stack of the first substrate and the second substrate, in which the first solder bumps and the second solder bumps are temporarily tacked, inside a furnace, exhausting the inside of the furnace where the stack is disposed to be in a reduced pressure atmosphere, and joining the first solder bumps and the second solder bumps by increasing a temperature inside the furnace in the reduced pressure atmosphere up to a temperature in a range of a melting temperature of the first and second solder bumps and higher, and melting the first and second bumps. A carboxylic acid gas is introduced into the furnace at least in the temperature range of the melting temperature of the first and second solder bumps and higher to make a carboxylic acid concentration in a range from 0.1 to 2.8 vol % while maintaining a pressure inside the furnace in a range of $5\times10^3$ to $3\times10^4$ Pa.

First Embodiment

Figure 1A:
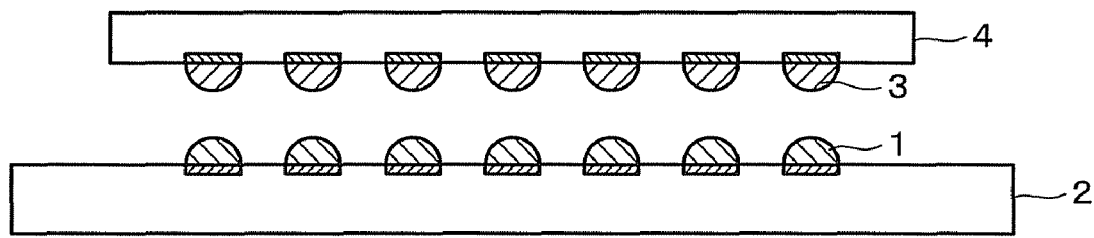
FIG. 1A to FIG. 1C are cross-sectional views showing a process of manufacturing a semiconductor device according to a first embodiment.

FIG. 1A to FIG. 10 are cross-sectional views showing a process of manufacturing a semiconductor device according to a first embodiment. As shown in FIG. 1A, a first substrate 2 having first solder bumps 1 and a second substrate 4 having second solder bumps 3 are prepared. The first and second substrates 2, 4 are, for example, semiconductor chips (silicon (Si) chips or the like) or silicon (Si) interposers. A combination of the first and second substrates 2, 4, which is, for example, a combination of a first semiconductor chip (2) and a second semiconductor chip (4), a combination of a Si interposer (2) and a semiconductor chip (4), a combination of a semiconductor chip (2) and a Si interposer (4), or the like, is not limited in particular.

Figure 2:
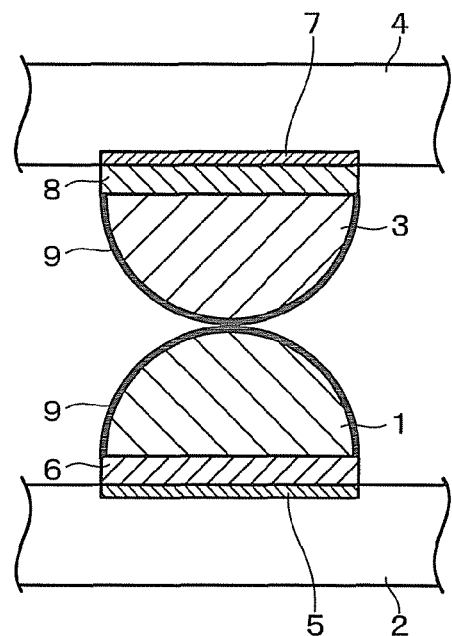
FIG. 2 is a cross-sectional view showing a state of solder bumps in the process of manufacturing the semiconductor device shown in FIG. 1A to FIG. 1C in an enlarged manner.

The first and second solder bumps 1, 3 are arranged in a matrix form in prescribed regions of the substrates 2, 4 respectively. The solder bumps 1, 3 as shown in FIG. 2 respectively, are formed on electrode pads 5, 7 provided on the surfaces of the substrates 2, 4 via barrier metal layers 6, 8. As a constituent material for the solder bumps 1, 3, for example, a lead-free solder alloy such as Sn—Ag based solder alloy, Sn—Cu based solder alloy, Sn—Ag—Cu based solder alloy, Sn—Bi based solder alloy, or Sn—In based solder alloy is used, or an Sn—Pb based solder alloy is used. The solder bumps 1, 3 may also be one of lead-free solder containing substantially no lead and lead solder.

The solder bumps 1, 3 are formed by, for example, a plating method or using micro-balls made of a solder alloy. Oxide films do not exist on surfaces of the solder bumps 1, 3 just after being formed on the electrode pads 5, 7, but as time passes, the surfaces of the solder bumps 1, 3 are oxidized as shown in FIG. 2. Oxide films 9 formed on the surfaces of the solder bumps 1, 3 cause increase of resistance between the solder bumps 1 and 3 when the solder bumps 1, 3 are melted and connected and a connection failure to occur between the solder bumps 1 and 3. Thus, it is necessary to remove the oxide films 9 on the surfaces of the solder bumps 1, 3 before heating and melting the solder bumps 1, 3.

Figure 1B:
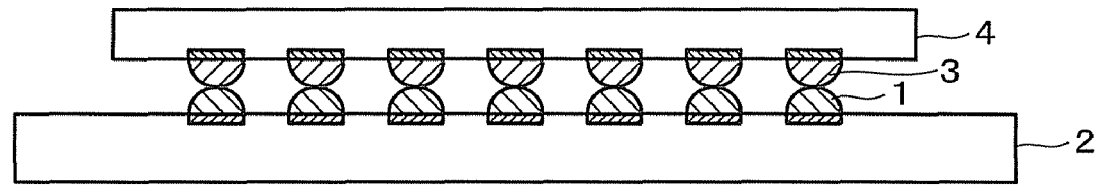
Figure 3:
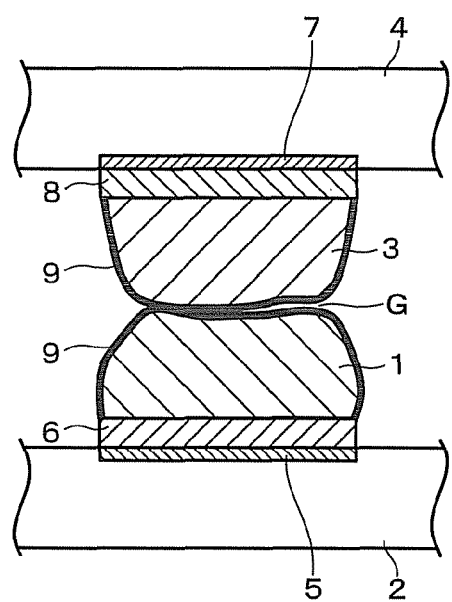
FIG. 3 is a cross-sectional view showing a state where the solder bumps are temporarily tacked to each other in the process of manufacturing the semiconductor device shown in FIG. 1A to FIG. 1C in an enlarged manner.

When flip-chip connecting the first substrate 2 and the second substrate 4, first, the second substrate 4 is stacked on the first substrate 2 while aligning the first solder bumps 1 and the second solder bumps 3. At this time, as shown in FIG. 1B and FIG. 3, the first solder bumps 1 and the second solder bumps 3 are temporarily tacked. The temporary tacking need to have strength to such a degree that the upper and lower substrates 2, 4 do not detach when a next process (process of removing the oxide films 9) is applied. When temporarily tacking the solder bumps 1, 3, application of ultrasonic waves and loads under room temperature by an ultrasonic flip-chip bonder, application of a temperature in the vicinity of a melting point of the solder and loads by a pulse heater heating-type flip-chip bonder, or the like is employed.

The first solder bumps 1 and the second solder bumps 3 are temporarily tacked in a state where the oxide films 9 exist on the surfaces of the solder bumps 1, 3, so that the first solder bumps 1 and the second solder bumps 3 are brought into a state where the oxide films 9 are caught in contact interfaces between the first solder bumps 1 and the second solder bumps 3. However, the first solder bumps 1 and the second solder bumps 3 are in a state of being temporarily tacked, and thus gaps G exist in the contact interfaces between the first solder bumps 1 and the second solder bumps 3 as shown in FIG. 3. By using the gaps G in the contact interfaces as above, the oxide films 9 existing on the surfaces of the solder bumps 1, 3, including the oxide films 9 caught in the contact interfaces, are removed by a carboxylic acid gas, and then the solder bumps 1, 3 are heated and melted.

Figure 4:
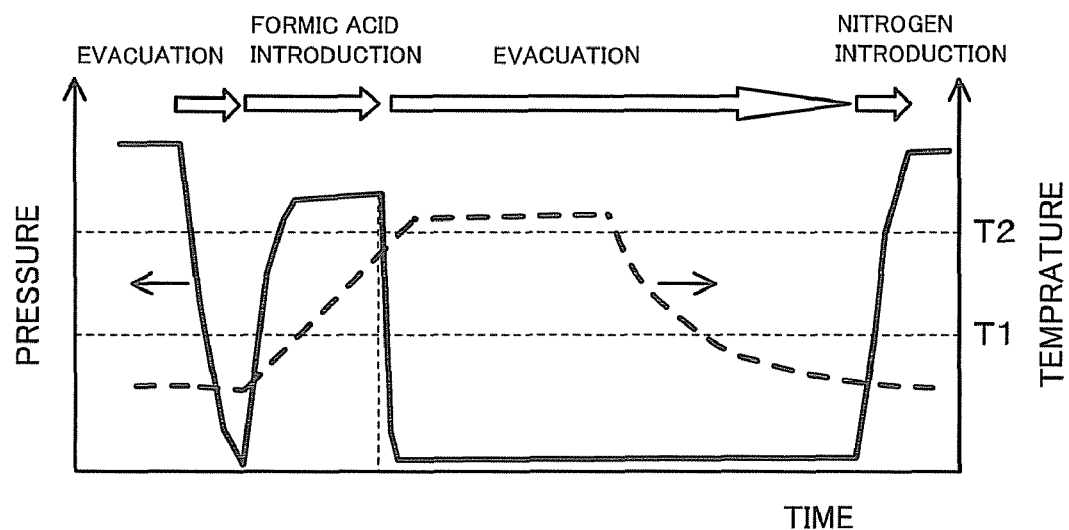
FIG. 4 is a view showing pressure and temperature profiles in a process of removing oxide films on surfaces of the solder bumps and a process of melting the solder bumps in the first embodiment.

A process of removing the oxide films 9 existing on the surfaces of the solder bumps 1, 3 and a process of heating and melting the solder bumps 1, 3 will be described with reference to pressure and temperature profiles inside a heating furnace shown in FIG. 4. First, a stack of the first substrate 2 and the second substrate 4, in which the solder bumps 1, 3 are temporarily tacked to each other, is disposed inside a heating furnace (reflow chamber), and then the heating furnace is evacuated to be in a reduced pressure atmosphere. Oxygen remaining inside the heating furnace oxides the solder bumps 1, 3, and thus it is preferable to exhaust gas in the heating furnace to a reduced pressure state of $1 \times 10^3$ Pa or less, which is 5 Pa or so in particular, from an atmospheric pressure state ($1.01 \times 10^5$ Pa). A carboxylic acid gas is introduced into the heating furnace in such a reduced pressure atmosphere.

The carboxylic acid gas is to reduce and remove the oxide films 9 existing on the surfaces of the solder bumps 1, 3. The carboxylic acid to be used as a reducing agent for the oxide films 9 is not limited in particular, and an aliphatic monovalent lower carboxylic acid or an aliphatic divalent lower carboxylic acid, which is, for example, a formic acid, an acetic acid, an acrylic acid, a propionic acid, an oxalic acid, a succinic acid, a malonic acid, or the like, can be cited. It is preferable to use a formic acid among them because a cost of a formic acid and a cost for gasification are low and further a formic acid is excellent in a reducing process of the oxide films 9. Note that the case when a formic acid is used as a representative example of the carboxylic acid will be mainly explained in the following, but the carboxylic acid as a reducing agent for the oxide films 9 is not limited to this.

After a carboxylic acid gas such as a formic acid is introduced into the heating furnace, or almost simultaneously with introduction of a carboxylic acid gas, the heating furnace is increased in temperature at a predetermined temperature increase rate (for example, 40 to 50° C./min). When a formic acid is used as a carboxylic acid gas, the reducing process of the oxide films 9 is exhibited at a temperature of 150° C. or higher. That is, a reduction temperature T1 of the oxide films 9 by a formic acid is approximately 150° C., and if the temperature inside the heating furnace becomes a temperature being equal to or higher than the reduction temperature T1, the oxide films 9 are reduced and removed. The solder bumps 1, 3 are exposed to a formic acid gas for, for example, several minutes in such a temperature range of the reduction temperature T1 of the oxide films 9 and higher, and thereby the oxide films 9 existing on the surfaces of the solder bumps 1, 3 are reduced and removed.

It is preferable that a pressure inside the heating furnace where the carboxylic acid gas is introduced is set to be in a state lower than an atmospheric pressure. The concrete pressure inside the furnace is preferable to be equal to or less than $8 \times 10^4$ Pa, for example, depending on an introduction amount of the carboxylic acid gas. However, if the temperature inside the heating furnace increases up to a temperature of a melting point of the solder bumps 1, 3 or higher in such a state, (which is a state where the carboxylic acid gas is only introduced), there occurs a fear that the carboxylic acid gas that has entered the above-described gaps G and gas that has occurred at the time of the reduction of the oxide films 9 are taken into the melted solder bumps 1, 3 and voids are formed.

In the first embodiment, the heating furnace is evacuated to remove the carboxylic acid gas in a temperature range from the reduction temperature T1 of the oxide films 9 by the carboxylic acid gas to lower than a melting temperature (melting point T2) of the solder bumps 1, 3. That is, by operating a vacuum pump connected to the heating furnace, the atmosphere inside the heating furnace is exhausted to be in a reduced pressure state. The atmosphere inside the heating furnace is evacuated in this manner before reaching the melting point T2 of the solder bumps 1, 3 (before the solder bumps 1, 3 are melted), thereby the carboxylic acid gas that has entered the gaps G and the gas that has occurred at the time of the reduction of the oxide films 9 can be removed from the contact interfaces between the solder bumps 1 and 3.

The carboxylic acid gas that has entered the gaps G and the gas that has occurred at the time of the reduction of the oxide films 9 are removed from the contact interfaces (the gaps G) between the solder bumps 1 and 3, and then, the solder bumps 1, 3 are melted, thereby voids ascribable to the gas that has entered or occurred in the gaps G, namely voids to occur inside the solder bumps 1, 3 after being melted can be suppressed. Further, even when the carboxylic acid gas is removed before reaching the melting point T2 of the solder bumps 1, 3, the solder bumps 1, 3 have already been exposed to the carboxylic acid gas at a stage prior to the removal, and thereby the oxide films 9 existing on the surfaces of the solder bumps 1, 3, including the oxide films 9 caught in the contact interfaces, can be removed. Thus, in the process of melting the solder bumps 1, 3, it makes it possible to suppress a connection failure between the solder bumps 1 and 3 and an increase in resistance between the solder bumps 1 and 3.

The evacuation for exhausting an atmosphere gas inside the heating furnace may be performed in the temperature range from the reduction temperature T1 of the oxide films 9 to lower than the melting point T2 of the solder bumps 1, 3. However, depending on a temperature increase rate of the heating furnace, if the timing of the evacuation inside the heating furnace is too early, there occurs a fear that a period of time to expose the solder bumps 1, 3 to the carboxylic acid gas becomes insufficient. On the other hand, if the timing of the evacuation inside the heating furnace is too late, there occurs a fear that the gas cannot be sufficiently discharged from the contact interfaces. It is preferable that an evacuation performance temperature is set in a range from a temperature 10° C. lower than the melting point T2 (T2—10[° C.]) to a temperature 5° C. lower than the melting point T2 of the solder bumps 1, 3 (T2—5[° C.]). When a period of time to expose the solder bumps 1, 3 to the carboxylic acid gas becomes insufficient, the heating furnace can be maintained at a temperature of the reduction temperature T1 of the oxide films 9 or higher for a predetermined period of time, or a temperature increase rate during the above period of time can be slowed.

The evacuation in the temperature range lower than the melting point T2 of the solder bumps 1, 3 is preferably performed to make the pressure inside the heating furnace equal to the pressure obtained before the carboxylic acid gas is introduced. Concretely, it is preferable that the heating furnace is evacuated until the pressure inside the heating furnace is brought into a reduced pressure state of $1 \times 10^3$ to $1 \times 10^4$ Pa in the temperature range from the reduction temperature T1 of the oxide films 9 to lower than the melting point T2 of the solder bumps 1, 3. This makes it possible to diffuse the carboxylic acid gas that has entered the gaps G in the contact interfaces and the gas that has occurred at the time of the reduction of the oxide films 9 to the surroundings.

Figure 5:
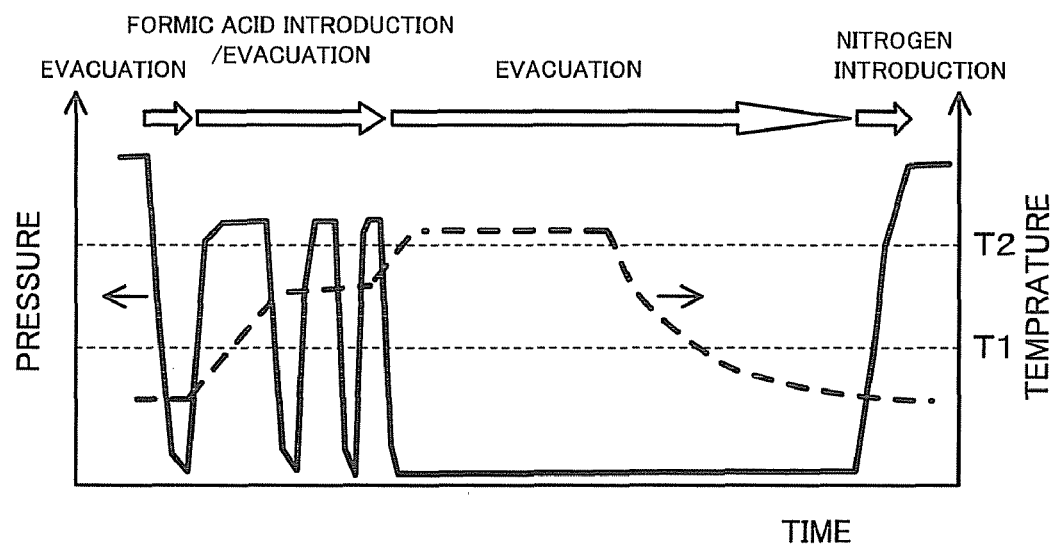
FIG. 5 is a view showing a modified example of the pressure and temperature profiles shown in FIG. 4.

There is sometimes a case that the oxide films 9 caught in the contact interfaces cannot be reduced completely only by introducing the carboxylic acid gas into the heating furnace once because the gaps G in the contact interfaces between the solder bumps 1 and 3 are narrow. Further, it is also possible to consider that the gas that has entered or occurred in the gaps G cannot be removed sufficiently depending on diameters and a temporary tacking state of the solder bumps 1, 3. With respect to such a point, as shown in FIG. 5, it is preferable that a process of introducing the carboxylic acid gas into the heating furnace and a process of evacuating inside the heating furnace (process of exhausting the carboxylic acid gas) are repeatedly performed a plurality of times in a temperature range of the reduction temperature T1 of the oxide films 9 by the carboxylic acid gas and higher.

A treatment in which the oxide films 9 are reduced and removed by introducing the carboxylic acid gas into the heating furnace and a treatment in which the carboxylic acid gas remaining after the oxide films 9 are reduced and the gas that has occurred at the time of the reduction of the oxide films 9 are discharged outside the heating furnace are repeatedly performed, thereby enabling the oxide films 9 caught in the contact interfaces to be well removed. Further, the gas that has entered or occurred in the gaps G in the contact interfaces can also be discharged more securely. Thus, the solder bumps 1, 3 are thereafter melted to be joined, thereby enabling voids to occur inside the solder bumps 1, 3 after being melted to be suppressed while more securely suppressing a connection failure between the solder bumps 1 and 3 and an increase in resistance value between the solder bumps 1 and 3 after being melted.

When the process of introducing the carboxylic acid gas and the process of evacuating inside the heating furnace are repeatedly performed a plurality of time, it is preferable that the heating furnace is maintained in the temperature range from the reduction temperature T1 of the oxide films 9 by the carboxylic acid gas to lower than the melting point T2 of the solder bumps 1, 3 for a predetermined period of time. This makes it possible to repeatedly perform the treatment of reducing the oxide films 9 and the treatment of discharging the gas before reaching the melting point T2 of the solder bumps 1, 3. The number of times in which the process of introducing the carboxylic acid gas and the process of evacuating inside the heating furnace are repeatedly performed is not limited in particular, but considering an effect obtained after these processes are repeatedly performed and an increase in process time, it is preferable that the gas introduction and the evacuation are repeatedly performed in a range of three to five times.

Thereafter, by increasing the temperature inside the heating furnace up to a temperature range of the melting point T2 of the solder bumps 1, 3 and higher, the solder bumps 1, 3 are melted. In the case when the solder bumps 1, 3 are composed of lead-free solder, for example, a melting point of the lead-free solder differs depending on the composition of a solder alloy but is approximately 220 to 230° C., so that the solder bumps 1, 3 are heated up to such a temperature or higher to be melted. In the case when the solder bumps 1, 3 are composed of lead solder, the solder bumps 1, 3 are heated up at a temperature of 183° C. or higher, which is a melting point of the lead solder, to be melted.

Figure 1C:
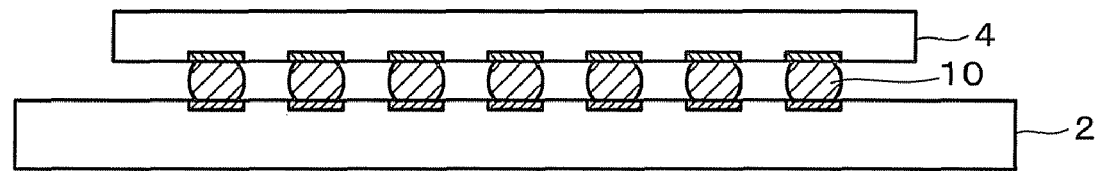

The melted solder bumps 1, 3 are integrated to constitute connection parts 10 as shown in FIG. 1C. The first embodiment promotes the diffusion of the gas that has entered or occurred in the gaps G in the contact interfaces to the surroundings while removing the oxide films 9 caught in the contact interfaces between the solder bumps 1 and 3. Thus, it makes it possible to suppress the occurrence of voids inside the connection parts 10 while forming the good connection parts (connection parts excellent in shapes, continuity, and so on) 10 by the solder bumps 1, 3. That is, the electrically and mechanically excellent connection parts 10 can connect the substrates 2 and 4.

Figure 6:
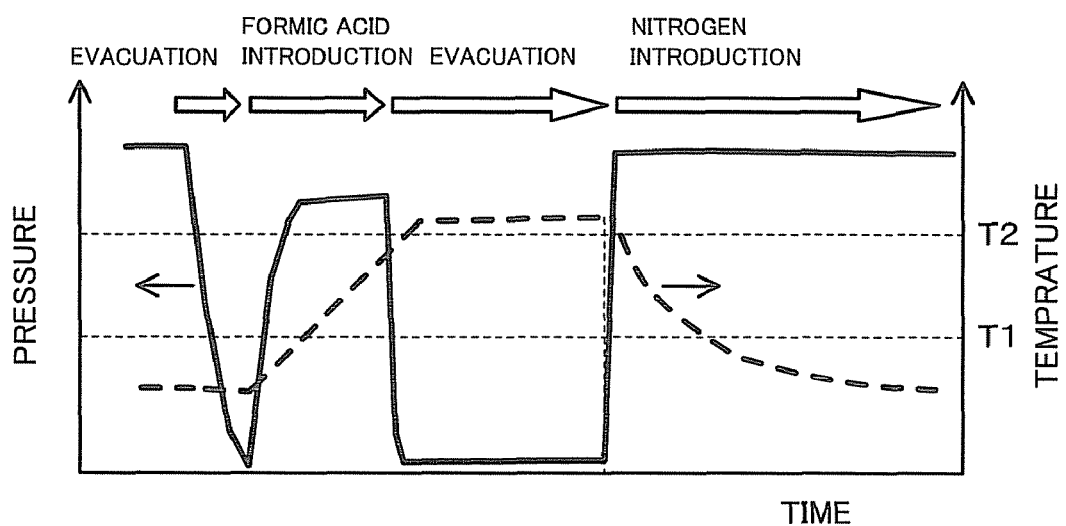
FIG. 6 is a view showing another modified example of the pressure and temperature profiles shown in FIG. 4.
Figure 7:
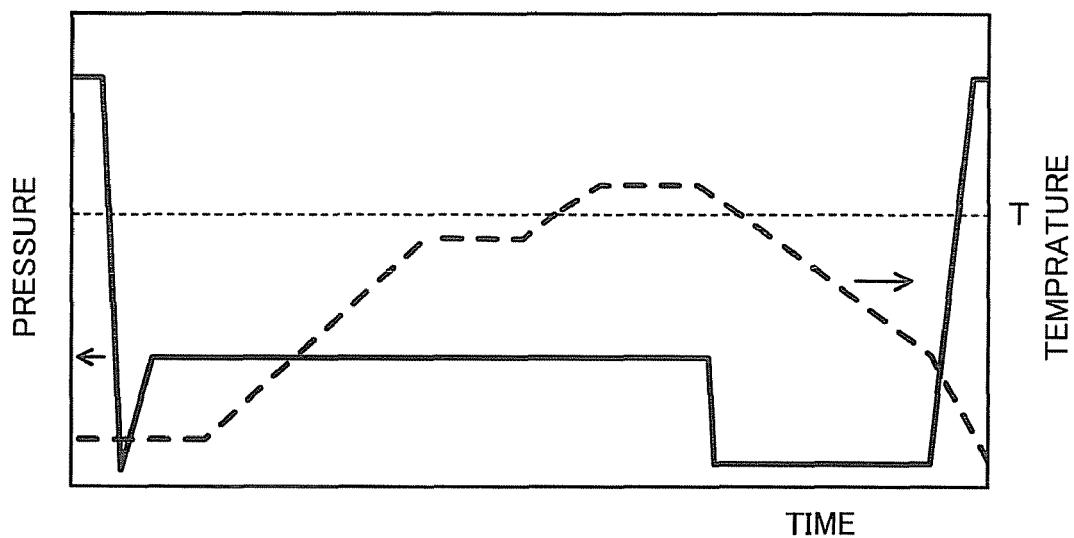
FIG. 7 is a view showing pressure and temperature profiles in a process of removing oxide films on surfaces of solder bumps and a process of melting the solder bumps in a second embodiment.

Then, the inside of the heating furnace is reduced in temperature to a temperature enabling a connection structure to be taken out easily, which is a temperature of, for example, 100° C. or so, and the inside of the heating furnace is returned to an atmospheric pressure by introducing an inert gas such as a nitrogen gas into the heating furnace, and thereafter, the structure in which the first substrate 2 and the second substrate 4 are connected via the connection parts 10 composed of the solder bumps 1, 3 is taken out of the heating furnace. The return from the reduced pressure to the atmospheric pressure inside the heating furnace may be performed after the temperature inside the heating furnace is reduced down to the temperature enabling the connection structure to be taken out easily in this manner, but it is also effective that as shown in FIG. 6, for example, the pressure inside the heating furnace is momentarily-returned to the atmospheric pressure by introducing an inert gas such as a nitrogen gas into the heating furnace at the temperature range of the melting point T2 of the solder bumps 1, 3 and higher.

By momentarily-returned the pressure inside the heating furnace to the atmospheric pressure while the solder bumps 1, 3 are being melted, small air bubbles remaining inside the melted solder bumps 1, 3 (connection parts 10 in a melted state) can be crushed. That is, large voids ascribable to the gas in the contact interfaces between the solder bumps 1 and 3 can be removed by evacuating inside the heating furnace in the temperature range lower than the melting point T2 of the solder bumps 1, 3, but there is sometime a case that small voids remain in the vicinities of the interfaces. Such small voids are crushed by applying pressure to them from the surroundings while the solder bumps 1, 3 are being melted, thereby the more sound connection parts 10 can be obtained.

The structure (a connection body of the first substrate 2 and the second substrate 4) taken out of the heating furnace is conveyed to a commonly-used assembly process similarly to a general semiconductor device. The assembly process is selected depending on a semiconductor device and is not limited in particular. One example of the assembly process will be described. First, a thermosetting underfill resin is filled in a gap between the first the second substrate 2, 4 and is cured. The connection body of the first substrate 2 and the second substrate 4 is mounted on, for example, a third substrate composed of a wiring substrate, and then the connection body and the third substrate are connected by wire bonding or the like. Such a structure is resin-molded, and then an outer lead ball is disposed thereon to form an external connection terminal of a semiconductor device (semiconductor package).

Second Embodiment

In a process of manufacturing a semiconductor device in a second embodiment, similarly to the first embodiment (see FIG. 1A to FIG. 1C, FIG. 2, and FIG. 3), a second substrate 4 is stacked on a first substrate 2 while aligning first solder bumps 1 and second solder bumps 3. The first solder bumps 1 and the second solder bumps 3 are temporarily tacked. A concrete example of the substrates 2, 4, a constituent material for the solder bumps 1, 3, a method of temporarily tacking the solder bumps 1, 3, and so on are similar to those in the first embodiment.

Next, similarly to the first embodiment, a stack of the first substrate 2 and the second substrate 4, in which the solder bumps 1, 3 are temporarily tacked to each other, is disposed inside a heating furnace (reflow chamber), and then the heating furnace is evacuated to be in a reduced pressure atmosphere. Oxygen remaining inside the heating furnace oxides the solder bumps 1, 3, so that it is preferable that gas in the heating furnace is exhausted to be in a reduced pressure state of $1 \times 10^3$ Pa or less, which is 5 Pa or so in particular, from an atmospheric pressure state ($1.01 \times 10^5$ Pa). A carboxylic acid gas is introduced into the heating furnace in such a reduced pressure atmosphere, and the heating furnace is increased in temperature up to a melting temperature (melting point T) of the solder bumps 1, 3 or higher. As a reducing agent for oxide films 9, a carboxylic acid gas similar to that of the first embodiment can be used, and it is preferable to use a formic acid gas from the viewpoint of cost and a reducing process in particular.

The introduction of the carboxylic acid gas is performed while maintaining a pressure (an ambient pressure) inside the heating furnace in a range of $5 \times 10^3$ to $3 \times 10^4$ Pa. That is, the carboxylic acid gas is introduced into the heating furnace while maintaining the heating furnace in a moderate reduced pressure state. Concretely, the heating furnace is evacuated to remove oxygen inside the heating furnace, and then the carboxylic acid gas having a moderate concentration and flow rate is continued to be supplied while continuing the evacuation (exhaust). This makes it possible to perform a process of melting the solder bumps 1, 3 under a reduced pressure atmosphere in which the concentration of the carboxylic acid gas inside the heating furnace is maintained in a moderate state.

When the concentration of the carboxylic acid gas inside the heating furnace in the process of melting the solder bumps 1, 3 is too high, the redundant carboxylic acid gas is taken into the melted solder bumps 1, 3 to thereby become voids. In order to suppress the occurrence of voids by the carboxylic acid gas as above, in the second embodiment, the pressure inside the heating furnace in the process of melting the solder bumps 1, 3 is set to be equal to or less than $3 \times 10^4$ Pa. When the pressure inside the heating furnace exceeds $3 \times 10^4$ Pa, gas volume to be taken into the melted solder bumps 1, 3 is increased, and voids are likely to occur inside the solder bumps 1, 3.

Despite the concentration of the carboxylic acid gas under such a reduced pressure atmosphere, the oxide films 9 on surfaces of the solder bumps 1, 3 are reduced and removed. That is, when the concentration of the carboxylic acid gas inside the heating furnace is set on the side of a relatively low concentration but the solder bumps 1, 3 provided on the upper and lower substrates 2, 4 are melted to be connected, the oxide films 9 existing on the surfaces of the solder bumps 1, 3 can be reduced and removed. However, when the pressure inside the heating furnace becomes less than $5 \times 10^3$ Pa, the concentration of the carboxylic acid gas becomes too low, resulting that the oxide films 9 cannot be reduced and removed sufficiently. Thus, the pressure inside the heating furnace in the process of melting the solder bumps 1, 3 is set to be equal to or more than $5 \times 10^3$ Pa.

A process of introducing the carboxylic acid gas under the above-described reduced pressure atmosphere is performed so that a carboxylic acid concentration falls within a range of 0.1 to 2.8% at a volume ratio. When this carboxylic acid concentration is converted into a molar concentration of, for example, a formic acid, it falls within a range of $4.1 \times 10^{-4}$ to $3.1 \times 10^{-2}$ mol/L. When the concentration of the carboxylic acid gas exceeds 2.8 vol %, the gas concentration inside the heating furnace is increased, resulting that voids are likely to occur inside the solder bumps 1, 3. On the other hand, when the concentration of the carboxylic acid gas is less than 0.1 vol %, a reducing process of the oxide films 9 by the carboxylic acid gas cannot be sufficiently obtained, and thus there occurs a fear that a connection failure and an increase in resistance value between the solder bumps 1 and 3 are caused.

It is preferable that the pressure inside the heating furnace in the process of melting the solder bumps 1, 3 is set in a range of 1.3 to $2.7 \times 10^4$ Pa. It is more preferable that the concentration of the carboxylic acid gas at this time is set in the range of 0.1 to 2.8 vol %, which is further set in a range of 0.1 to 1 vol %. The concentration of the carboxylic acid gas under the above-described reduced pressure atmosphere is set on the side of a lower concentration, and thereby voids inside the melted solder bumps 1, 3 can be suppressed with high reproducibility. Thus, the concentration of the carboxylic acid gas is desirable to be set in the range of 0.1 to 1 vol %.

The temperature inside the heating furnace in which the furnace inside pressure (ambient pressure) and the carboxylic acid concentration are set as above is increased up to a temperature range of the melting point T of the solder bumps 1, 3 and higher, and thereby the solder bumps 1, 3 are melted. In the case when the solder bumps 1, 3 are composed of lead-free solder, a melting point of the lead-free solder differs depending on the composition of a solder alloy but is approximately 220 to 230° C., so that the solder bumps 1, 3 are heated up at a temperature of the above melting point or higher to be melted. In the case when the solder bumps 1, 3 are composed of lead solder, the solder bumps 1, 3 are heated up at a temperature of 183° C. or higher, which is a melting point of the lead solder, to be melted. The melted solder bumps 1, 3 are integrated to constitute connection parts 10 as shown in FIG. 1C.

At the time of melting the solder bumps 1, 3, the oxide films 9 are reduced and removed by the carboxylic acid gas existing inside the heating furnace. At this time, the ambient pressure and the gas concentration in the heating furnace are lowered down to values capable of reducing the gas volume to be taken into the melted solder bumps 1, 3 within a range in which the reducing process of the oxide films 9 can be obtained, and thus it is suppressed that the carboxylic acid gas is taken into the connection parts 10 to be voids. That is, it makes it possible to remove the oxide films 9 and then to well connect the solder bumps 1 and 3 each other and to obtain the good connection parts 10 with a reduced amount of voids. Thus, the electrically and mechanically excellent connection parts 10 can connect the substrates 2 and 4.

Figure 8:
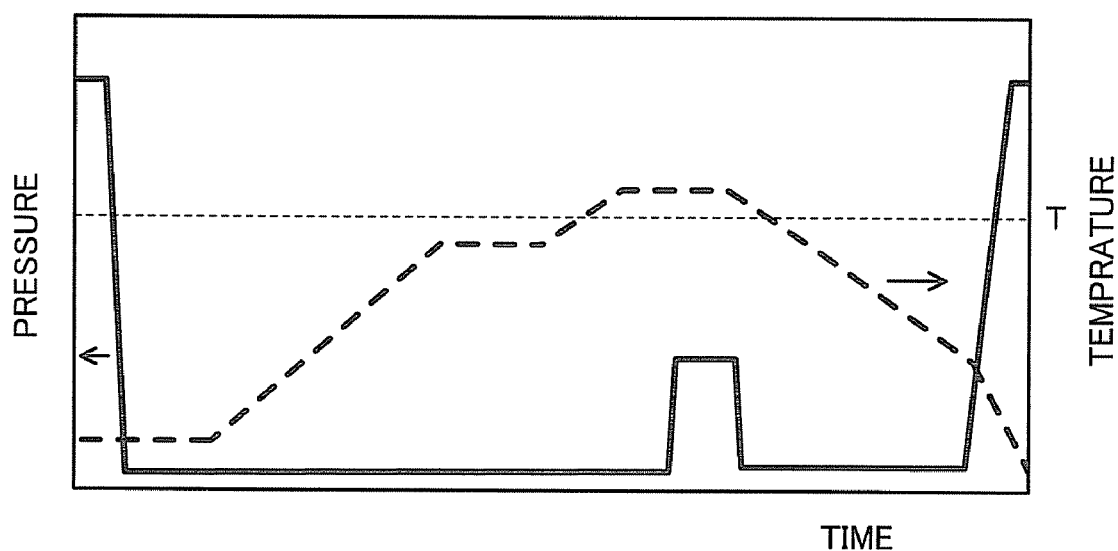
FIG. 8 is a view showing a modified example of the pressure and temperature profiles shown in FIG. 7.

In the case when a formic acid is used as the carboxylic acid gas, the reducing process of the oxide films 9 is exhibited at a temperature of 150° C. or higher, and thus the heating furnace may be maintained in a temperature range of the above temperature to lower than the melting point T of the solder bumps 1, 3 for a predetermined period of time. This makes it possible to increase an effect of removing the oxide films 9. However, the carboxylic acid gas is only necessary to exist at least at the time of melting the solder bumps 1, 3, so that as shown in FIG. 8, the carboxylic acid gas may also be introduced into the heating furnace only at the time of melting the solder bumps 1, 3 (in a temperature range of the melting point T and higher). The carboxylic acid gas is only necessary to be introduced at least at the time of melting the solder bumps 1, 3. The ambient pressure and the gas concentration at this time are the same as those described above.

The inside of the heating furnace is reduced in temperature down to room temperature to be retuned to an atmospheric pressure by introducing an inert gas such as a nitrogen gas into the heating furnace, and then a structure in which the first substrate 2 and the second substrate 4 are connected via the connection parts 10 composed of the solder bumps 1, 3 is taken out of the heating furnace. The structure (a connection body of the first substrate 2 and the second substrate 4) taken out of the heating furnace is conveyed to an assembly process similarly to a common semiconductor device. The assembly process is selected depending on a semiconductor device, and is not limited in particular. A concrete example of the assembly process is the same as that described in the first embodiment.

Next, a concrete example of the process of manufacturing the semiconductor device in the second embodiment will be explained. First, two Si chips having solder bumps (diameters: 25 μm) composed of lead-free solder are prepared. These solder bumps of the Si chips are temporarily tacked to each other by using a pulse heater heating-type flip-chip bonder (a heating temperature: 250° C.). This temporarily tacked body is disposed inside a heating furnace, and then the heating furnace is evacuated to be equal to or less than 5 Pa. An ambient pressure inside the heating furnace thereafter, a concentration and a flow rate of a formic acid gas to be supplied into the heating furnace are adjusted as follows.

In an example 1, a formic acid gas having a predetermined concentration is supplied into a heating furnace in which a furnace inside pressure is set to be $1.3 \times 10^4$ Pa (100 Torr) at a flow rate of 15 L/min. A formic acid concentration inside the furnace at this time is 1.4 vol % ($6.2 \times 10^{-3}$ mol/L). In an example 2, into a heating furnace in which a furnace inside pressure is set to be $1.3 \times 10^4$ Pa (100 Torr), a formic acid gas having a predetermined concentration is supplied at a flow rate of 1 L/min, and as an attenuate gas, a nitrogen gas is supplied at a flow rate of 14 L/min. A formic acid concentration inside the furnace at this time is 0.1 vol % ($4.1 \times 10^{-4}$ mol/L).

As a comparative example 1, a formic acid gas having a predetermined concentration is supplied into a heating furnace in which a furnace inside pressure is set to be $8 \times 10^4$ Pa (600 Torr) at a flow rate of 15 L/min. A formic acid concentration inside the furnace at this time is 8.2 vol % ($3.7 \times 10^{-2}$ mol/L). In a comparative example 2, into a heating furnace in which a furnace inside pressure is set to be $8 \times 10^4$ Pa (600 Torr), a formic acid gas having a predetermined concentration is supplied at a flow rate of 1 L/min, and as an attenuate gas, a nitrogen gas is supplied at a flow rate of 14 L/min. A formic acid concentration inside the furnace at this time is 0.6 vol % ($2.5 \times 10^{-3}$ mol/L).

The heating furnace in each of the examples is increased in temperature up to 265° C. and is maintained for three minutes at the temperature of 265° C., and then is reduced in temperature down to room temperature. In this manner, the solder bumps of the two Si chips are melted to be joined respectively. Five of a chip joined body, (which is a structure in which the two Si chips are connected by melted and solidification bodies of the solder bumps), in each of the examples are each manufactured, and the presence/absence of voids in the solder bumps (each 162 bumps/810 bumps in total) at the same single point in each of the chips are examined. With regard to voids inside the solder bumps, the presence/absence of large voids whose diameter is equal to or more than 10 μm and the presence/absence of small voids whose diameter is less than 10 μm are examined respectively. These results of measurement are shown in Table 1.

TABLE 1

|  | Furnace inside pressure (Pa) | Formic acid concentration (vol %) | Large voids | | Small voids | | Total | |
| --- | --- | --- | --- | --- | --- | --- | --- | --- |
|  |  |  | Number | Occurrence rate (%) | Number | Occurrence rate (%) | Number | Occurrence rate (%) |
| Example 1 | $1.3 \times 10^4$ | 1.4 | 1/810 | 0.1 | 0/810 | 0 | 1/810 | 0.1 |
| Example 2 | $1.3 \times 10^4$ | 0.1 | 0/810 | 0 | 0/810 | 0 | 0/810 | 0 |
| Comparative example 1 | $8 \times 10^4$ | 8.2 | 47/810 | 5.8 | 64/810 | 7.9 | 111/810 | 13.7 |
| Comparative example 1 | $8 \times 10^4$ | 0.6 | 10/810 | 1.2 | 11/810 | 1.4 | 21/810 | 2.6 |

As is clear from Table 1, in the examples 1 and 2 in which the pressure inside the heating furnace is set in a range of $5 \times 10^3$ to $3 \times 10^4$ Pa and the formic acid concentration at this time is set in a range of 0.1 to 2.8 vol %, it is found that the number of bumps in which voids have occurred is greatly reduced as compared with the comparative examples 1 and 2. Further, from the result of the comparative example 2, it is found that even though the formic acid concentration is set in the range of 0.1 to 2.8 vol %, a sufficient effect of suppressing voids cannot be obtained in the case when the pressure inside the heating furnace exceeds $3 \times 10^4$ Pa.

Results when conditions of the above-described examples are changed are shown in Table 2. In Table 2, a sample 1 is such that solder bumps are melted on the same condition as that of the example 2. However, a temperature condition is set as 220° C. for three minutes (maintenance)→265° C. for three minutes (maintenance). In a sample 2, a formic acid gas (1 L/min) and a nitrogen gas (14 L/min) are supplied into a heating furnace in which a furnace inside pressure is set to be $2.7 \times 10^4$ Pa (200 Torr) so that a formic acid concentration becomes 0.2 vol %. In a sample 3, a formic acid gas (5 L/min) and a nitrogen gas (10 L/min) are supplied into a heating furnace in which a furnace inside pressure is set to be $2.7 \times 10^4$ Pa so that a formic acid concentration becomes 0.9 vol %.

In a sample 4, a formic acid gas (5 L/min) and a nitrogen gas (10 L/min) are supplied into a heating furnace in which a furnace inside pressure is set to be $1.3 \times 10^4$ Pa (100 Torr) so that a formic acid concentration becomes 0.5 vol %. In a sample 5, a formic acid gas (15 L/min) is supplied into a heating furnace in which a furnace inside pressure is set to be $1.3 \times 10^4$ Pa so that a formic acid concentration becomes 1.4 vol %. In a sample 6, a formic acid gas (15 L/min) is supplied into a heating furnace in which a furnace inside pressure is set to be $2.7 \times 10^4$ Pa so that a formic acid concentration becomes 2.8 vol %.

TABLE 2

|  | Furnace inside pressure (Pa) | Formic acid concentration (vol %) | The number of voids that have occurred (Large voids) | | Continuity test (Good products/Five products) |
| --- | --- | --- | --- | --- | --- |
|  |  |  | Number | Occurrence rate (%) |  |
| Sample 1 | $1.3 \times 10^4$ | 0.1 | 0/810 | 0 | 5/5 |
| Sample 2 | $2.7 \times 10^4$ | 0.2 | 0/810 | 0 | 5/5 |
| Sample 3 | $2.7 \times 10^4$ | 0.9 | 0/810 | 0 | 5/5 |
| Sample 4 | $1.3 \times 10^4$ | 0.5 | 0/810 | 0 | 5/5 |
| Sample 5 | $1.3 \times 10^4$ | 1.4 | 1/810 | 0.1 | 5/5 |
| Sample 6 | $2.7 \times 10^4$ | 2.8 | 3/810 | 0.4 | 5/5 |

As is clear from the number of bumps in which voids have occurred shown in Table 2, it is found that an ambient pressure at the time of melting the solder bumps is set in a range of 1.3 to $2.7 \times 10^4$ Pa and the formic acid concentration is set in a range of 0.1 to 1 vol %, and thereby reproducibility of an effect of suppressing voids is improved. Note that in Table 2, continuity test results of the chip joined bodies in the respective samples are shown together. From the results of the continuity tests, it is found that in any one of the examples, the solder bumps are well melted and joined, and oxide films on surfaces of the bumps do not prevent the solder bumps from being connected each other.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:

stacking a second substrate having second solder bumps on a first substrate having first solder bumps while temporarily tacking the first solder bumps and the second solder bumps;

disposing a stack of the first substrate and the second substrate, in which the first solder bumps and the second solder bumps are temporarily tacked, inside a furnace;

exhausting gas in the furnace where the stack is disposed to be in a reduced pressure atmosphere;

introducing a carboxylic acid gas into the furnace in the reduced pressure atmosphere;

increasing a temperature inside the furnace where the carboxylic acid gas is introduced to a temperature in a range from a reduction temperature of oxide films on the first and second solder bumps by the carboxylic acid gas to lower than a melting temperature of the first and second solder bumps, so as to reduce and remove the oxide films formed on surfaces of the first and second solder bumps, including oxide films caught in between the temporarily tacked first solder bumps and second solder bumps, by the carboxylic acid gas introduced into the furnace;

exhausting gas in the furnace to be in a reduced pressure atmosphere at the temperature in the range from the reduction temperature of the oxide films to lower than the melting temperature of the first and second solder bumps, so as to discharge the carboxylic acid gas and gas generated by the reduction of the oxide films outside the furnace before increasing a temperature inside the furnace up to a temperature in a range of the melting temperature of the first and second solder bumps and higher; and joining the first solder bumps and the second solder bumps by increasing a temperature inside the furnace in the reduced pressure atmosphere up to a temperature in a range of the melting temperature of the first and second solder bumps and higher, and melting the first and second solder bumps.

2. The manufacturing method according to claim 1, wherein the gas in the furnace where the stack is disposed is exhausted to be in a reduced pressure atmosphere of $1\times10^3$ Pa or less.

3. The manufacturing method according to claim 1, wherein the carboxylic acid gas is introduced into the furnace while maintaining a pressure inside the furnace in a pressure lower than an atmospheric pressure.

4. The manufacturing method according to claim 1, wherein the carboxylic acid gas is introduced into the furnace while maintaining a pressure inside the furnace in a reduced pressure atmosphere of $8\times10^4$ Pa or less.

5. The manufacturing method according to claim 1, wherein a formic acid gas is introduced into the furnace as the carboxylic acid gas.

6. The manufacturing method according to claim 5, wherein the gas in the furnace where the formic acid gas is introduced is exhausted at a temperature in a range from 150° C. to lower than the melting temperature of the first and second solder bumps.

7. The manufacturing method according to claim 5, wherein the gas in the furnace where the formic acid gas is introduced is exhausted at a temperature in a range from a temperature 10° C. lower than the melting point of the first and second solder bumps to a temperature 5° C. lower than the melting point.

8. The manufacturing method according to claim 1, wherein introducing the carboxylic acid gas into the furnace and exhausting the gas in the furnace are repeatedly performed a plurality of times, and then the first solder bumps and the second solder bumps are melted.

9. The manufacturing method according to claim 1, wherein a pressure inside the furnace is returned to an atmospheric pressure in a state where the temperature inside the furnace in the reduced pressure atmosphere is in the range of the melting temperature of the first and second solder bumps and higher.

10. The manufacturing method according to claim 9, wherein the pressure inside the furnace is returned to the atmospheric pressure by introducing an inert gas into the furnace.

11. The manufacturing method according to claim 1, wherein the first substrate includes a semiconductor chip or a silicon interposer, and the second substrate includes a semiconductor chip or a silicon interposer.

12. The manufacturing method according to claim 1,
wherein the carboxylic acid gas is introduced into the furnace to make a carboxylic acid concentration in a range from 0.1 to 2.8 vol % while maintaining a pressure inside the furnace in a range of $5\times10^3$ to $3\times10^4$ Pa.

13. The manufacturing method according to claim 12,
wherein a formic acid gas is introduced into the furnace as the carboxylic acid gas, and
wherein the formic acid gas is introduced into the furnace to make a formic acid concentration in a range of $4.1\times10^{-4}$ to $3.1\times10^{-2}$ mol/L.

14. The manufacturing method according to claim 12, wherein the carboxylic acid gas is introduced into the furnace to make the carboxylic acid concentration in a range of 0.1 to 1 vol % while maintaining the pressure inside the furnace in a range of 1.3 to $2.7\times10^4$ Pa.

* * * * *